(12) United States Patent
Christian et al.

(10) Patent No.: US 6,500,681 B1
(45) Date of Patent: Dec. 31, 2002

(54) RUN-TO-RUN ETCH CONTROL BY FEEDING FORWARD MEASURED METAL THICKNESS

(75) Inventors: Craig William Christian, Buda, TX (US); H. Jim Fulford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/044,642

(22) Filed: Jan. 11, 2002

(51) Int. Cl.[7] .............................................. H01L 21/00
(52) U.S. Cl. .............................. 438/8; 438/5; 438/636; 438/685; 438/720; 438/742
(58) Field of Search ........................... 438/5, 8, 9, 636, 438/685, 688, 720, 742

(56) References Cited

U.S. PATENT DOCUMENTS

| | | | | |
|---|---|---|---|---|
| 5,254,830 A | * | 10/1993 | Zarowin et al. | 156/345.24 |
| 5,282,921 A | * | 2/1994 | Poultney | 358/495 |
| 5,308,447 A | * | 5/1994 | Lewis et al. | 216/23 |
| 5,450,205 A | * | 9/1995 | Sawin et al. | 216/60 |
| 5,795,493 A | * | 8/1998 | Bukhman et al. | 216/59 |
| 6,379,490 B1 | * | 4/2002 | Bollinger et al. | 438/14 |
| 6,428,673 B1 | * | 8/2002 | Ritzdorf et al. | 204/228.7 |

* cited by examiner

*Primary Examiner*—John F. Niebling
*Assistant Examiner*—Angel Roman
(74) *Attorney, Agent, or Firm*—Williams, Morgan & Amerson, P.C.

(57) ABSTRACT

Disclosed herein is a method comprised of forming a metal layer above a structure layer on a workpiece, measuring a thickness of the metal layer, determining, based upon the measured thickness of the metal layer, at least one parameter of an etching process to be performed on the metal layer, and performing the etching process comprised of the determined parameter on the metal layer. Also disclosed is a system comprised of a deposition tool for forming a metal layer above a structure layer on a workpiece, a metrology tool for measuring a thickness of the metal layer, a controller for determining, based upon the measured thickness of the metal layer, at least one parameter of an etch process to be performed on the metal layer, and an etch tool adapted to perform an etch process comprised of the determined parameter on the metal layer.

23 Claims, 10 Drawing Sheets

RUN-TO-RUN ETCH CONTROL BY FEEDING FORWARD MEASURED METAL THICKNESS

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an improved monitoring and diagnostics system for such tools would provide a means of monitoring this variability, as well as providing means for optimizing control of critical parameters.

Among the parameters it would be useful to monitor and control are metal layer thickness and metal layer thickness variations. Typically, following deposition of a metal layer, the metal layer is patterned and etched. However, due to variations in the metal layer thickness, the etch processing parameters typically have to be set to handle the "worst case scenario" that would provide for etching of the thickest of metal layers. Setting the etch processing parameters to provide for etching of the thickest of metal layers, however, typically leads to gouging of any underlying dielectric layers and/or undercutting or "footing" of any overlying anti-reflective coating layers and/or bottom films. This gouging and/or undercutting typically occurs when the metal layer is thinner than the thickest of metal layers.

Figure 1:
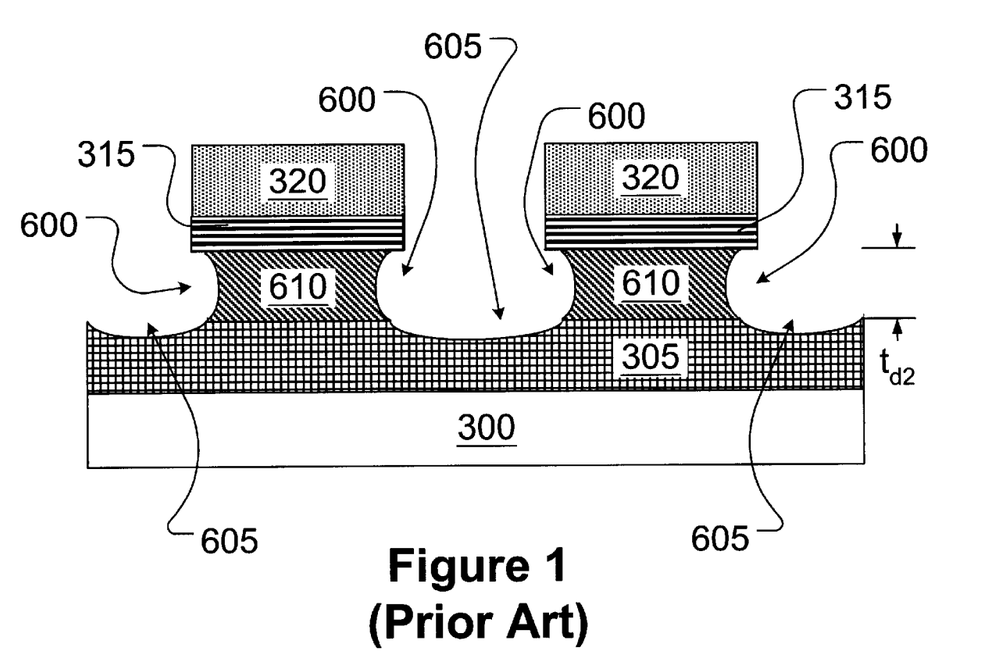
FIG. 1 schematically illustrates a conventional metal layer etch processing result.
Figure 5:
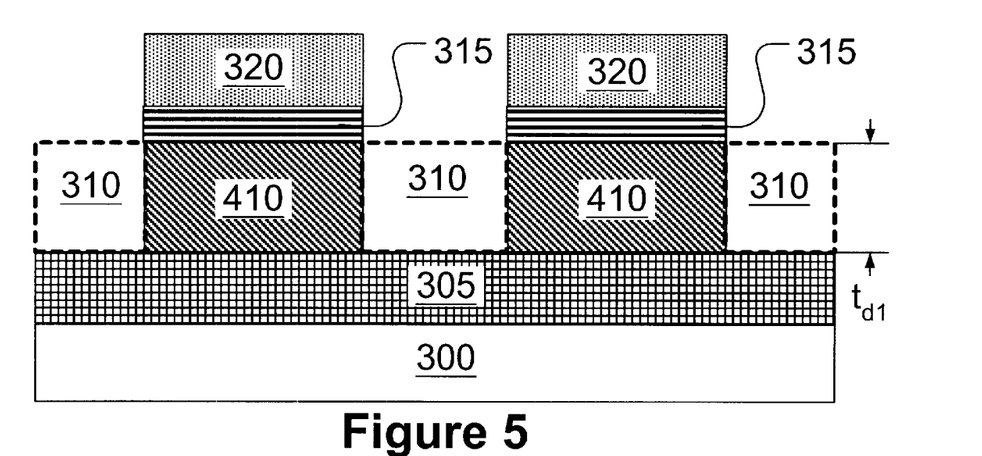
Figure 6:
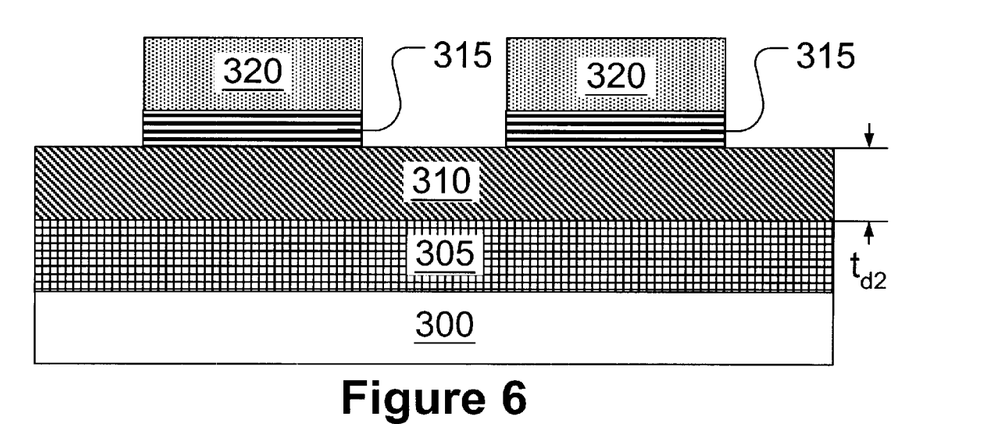
Figure 7:
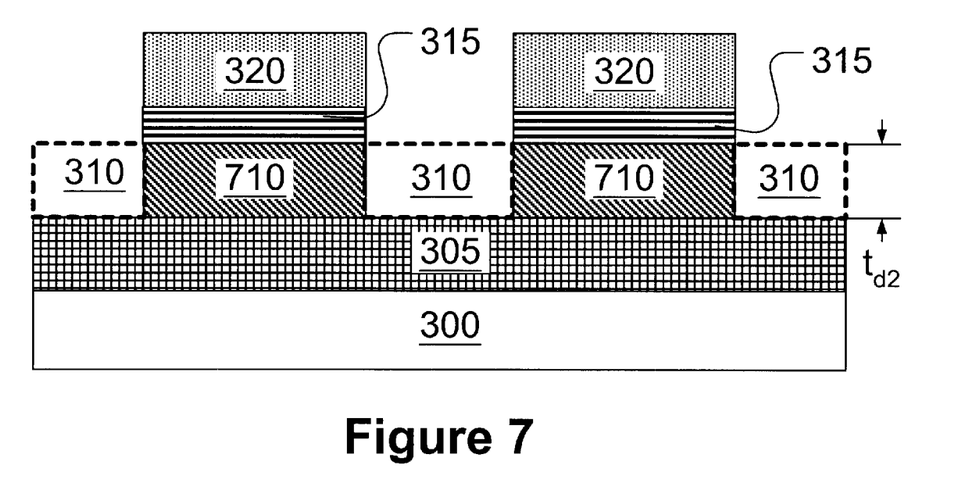

For example, as shown in FIG. 1, conventional etch processing that is designed to etch metal layers as thick as $td_{d1}$ (FIGS. 4 and 5) leads to gouging 605 of an underlying dielectric layer 305, and undercutting 600 of an overlying anti-reflective coating layer 315 when the metal layer is thinner than anticipated, e.g., when the metal layer 310 is only as thick as $t_{d2}$ (FIGS. 6 and 7). The gouging of any underlying dielectric layers and/or under-cutting or "footing" of any overlying anti-reflective coating layers and/or bottom films, in turn, decreases the ability to fill gaps with a subsequent gap-filling dielectric deposition. This may lead to inaccuracies and complications in the manufacturing processes.

The present invention is directed to overcoming, or at least reducing the effects of, one or more of the problems set forth above.

SUMMARY OF THE INVENTION

The present invention is directed to a control methodology useful in the manufacture of integrated circuit devices. In one illustrative embodiment, a method is disclosed herein that is comprised of forming a metal layer above a structure layer on a workpiece, measuring a thickness of the metal layer, determining, based upon the measured thickness of the metal layer, at least one parameter of an etching process to be performed on the metal layer, and performing the etching process comprised of the determined parameter on the metal layer. The thickness measurements may be made at one or more locations, and they may reflect across-layer thickness variations in the metal layer. The parameters of the etching process that may be varied include, along others, etch duration, process gas flow rates, pressure, backside cooling gas flow rates, power settings, etc.

Also disclosed herein is a system comprised of a deposition tool for forming a metal layer above a structure layer on a workpiece, a metrology tool for measuring a thickness of the metal layer, a controller for determining, based upon the measured thickness of the metal layer, at least one parameter of an etch process to be performed on the metal layer, and an etch tool adapted to perform an etch process comprised of the determined parameter on the metal layer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 2–12 schematically illustrate various embodiments of a method for manufacturing according to the present invention; and, more particularly:

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Figure 2:
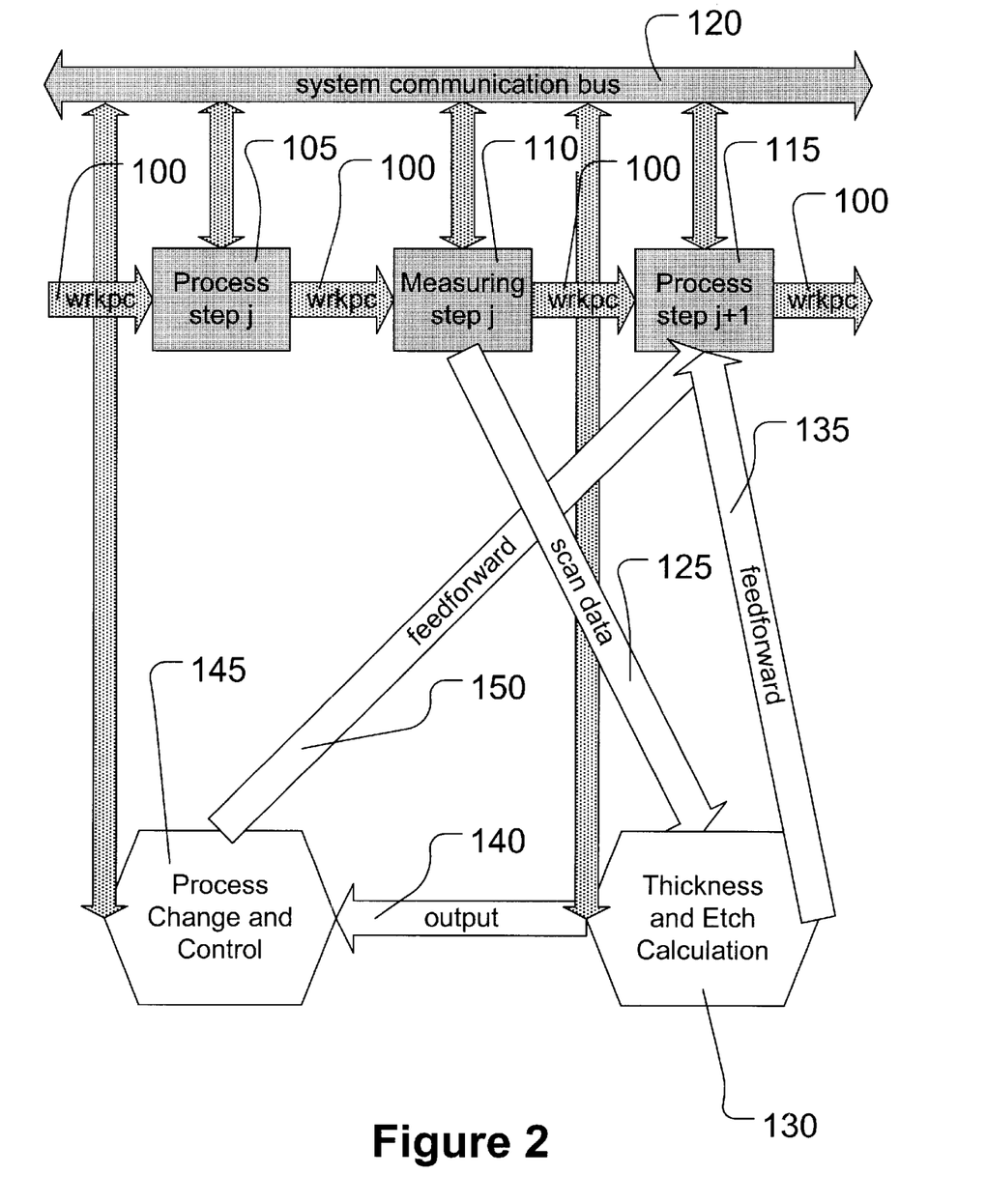
FIGS. 2–3 and 8–11 schematically illustrate a flow chart for various embodiments of a method for manufacturing according to the present invention.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Illustrative embodiments of a method for manufacturing according to the present invention are shown in FIGS. 2–12. As shown in FIG. 2, a workpiece 100, such as a semiconducting substrate or wafer, having zero, one or more process layers and/or semiconductor devices such as a metal-oxide-semiconductor field effect transistor (MOSFET or MOS transistor) disposed thereon, for example, is delivered to a processing step j 105, where j may have any value from j=1 to j=N. The total number N of processing steps, such as masking, etching, depositing material and the like, used to form the finished workpiece 100, may range from N=1 to about any finite value.

Figure 4:
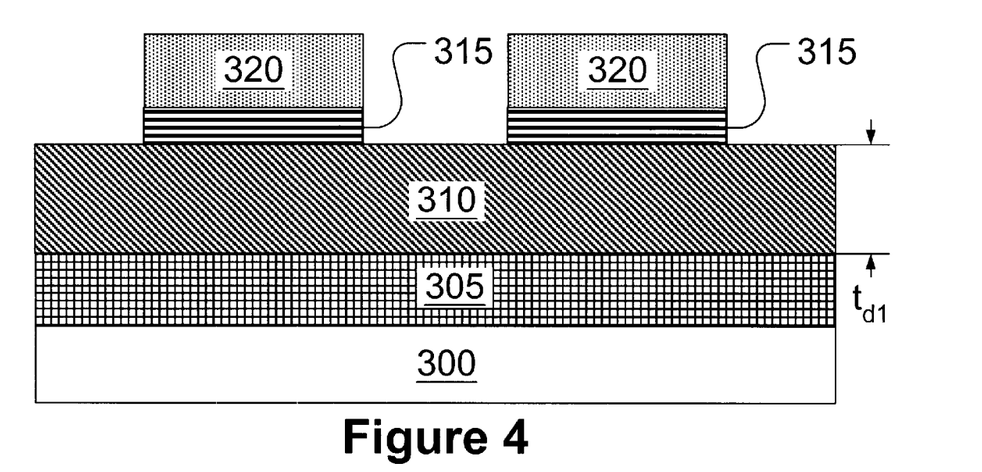
FIGS. 4–7 schematically illustrate formation of dielectric layers according to various illustrative embodiments of the present invention.

In various illustrative embodiments, the processing step j 105 may involve formation of a conductive layer, such as metal layer 310 as shown in FIG. 4. For example, the processing step j 105 may involve sputtering or physical vapor deposition (PVD) of an aluminum (Al) metal layer 310 as a portion of an interconnect layer connecting a underlying active areas, such as the source/drain regions of a metal-oxide-semiconductor field effect transistor (MOSFET or MOS transistor) with overlying metal structures (conductive lines, and the like), formed on the workpiece 100, as described more fully below in conjunction with FIGS. 4–7. Of course, the metal layer 310 may be comprised of a variety of other metals.

As shown in FIG. 2, a system communication bus 120 may be provided to facilitate communication between the processing step j 105, a measuring step j 110, and a further processing step j+1 115 for further processing, where j may have any value from j=1 to j=N, for a sequence of N total processing steps (when j=N, there will, of course, not be any further processing step N+1 115). Using the system communication bus 120, data and/or instructions may be exchanged between any or all of the various N processing and/or N measuring steps. In particular, using the system communication bus 120, scan data 125 from any measuring step j 110 may be exchanged between, and made available to, any or all of the various N processing and/or N measuring steps, which may, in turn, pass the scan data 125 on to any thickness and etch calculation step such as a thickness and etch calculation step 130. As shown in FIG. 2, the system communications bus 120 also provides communications between the processing step j 105, the measuring step j 110 and the further processing step j+1 115, and a thickness and etch calculation step 130 and a process change and control step 145, more fully described below.

Figure 3:
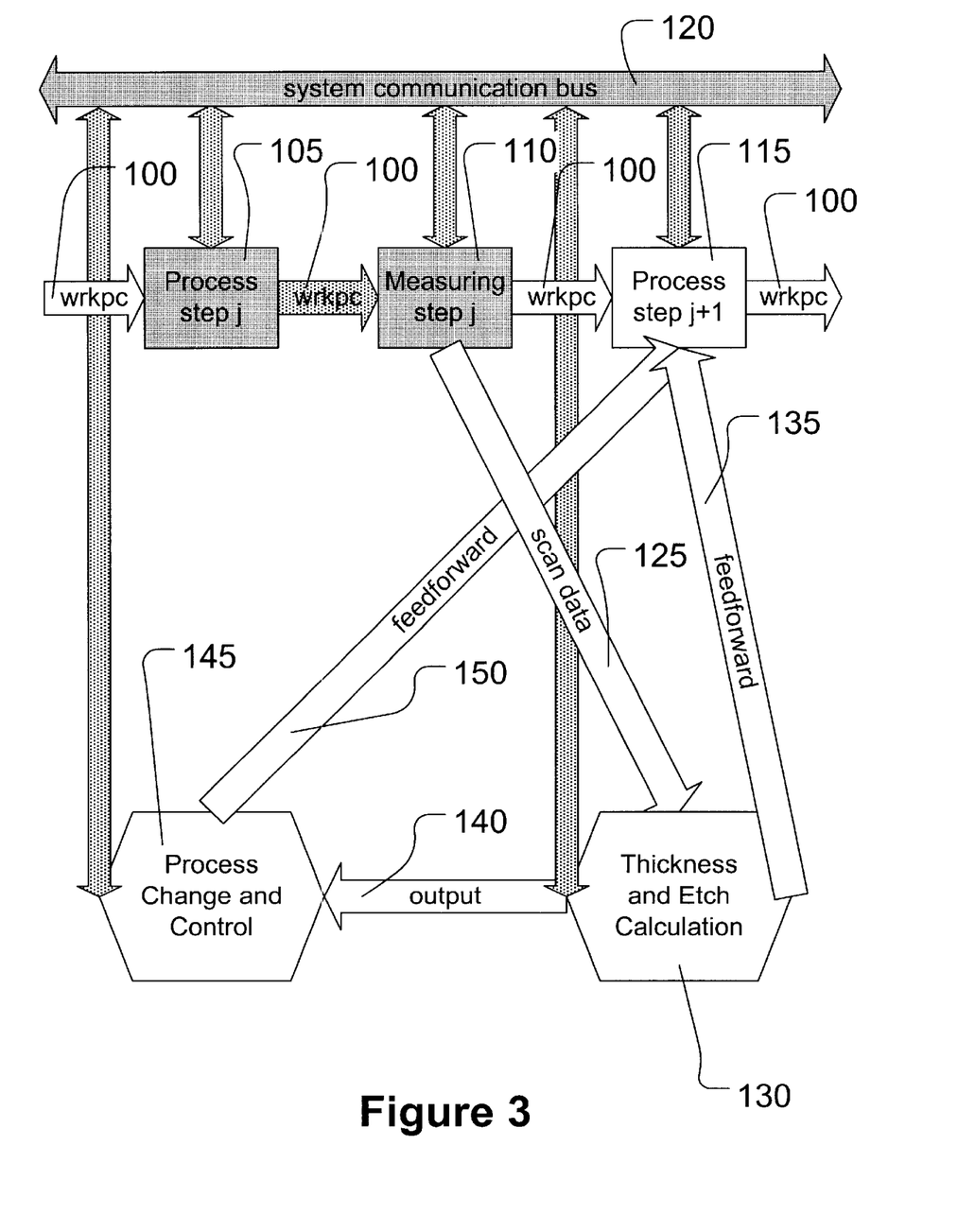

As shown in FIG. 3, the workpiece 100 is sent from the processing step j 105 and delivered to a measuring step j 110. In the measuring step j 110, the workpiece 100 is measured by having a metrology or measuring tool (not shown) measure one or more parameters characteristic of the processing performed in any of the previous processing steps (such as processing step j 105, where j may have any value from j=1 to j=N). The measurements in the measuring step j 110 produce the scan data 125 indicative of the one or more characteristic parameters measured in the measuring step j 110. As shown in FIG. 3, if there is further processing to do on the workpiece 100 (if j<N), then the workpiece 100 may be sent from the measuring step j 110 and delivered to a processing step j+1 115 for further processing.

In various illustrative embodiments, there is further processing to do on the work-piece 100(j<N), and the measuring step j 110 may be a thickness measurement of the metal layer 310 formed on the workpiece 100. FIGS. 4–7 schematically illustrate a thickness measurement for the metal layer 310 and subsequent processing to remove one or more portions of the metal layer 310 to form metal layer portions 410 and/or 710. As shown in FIG. 4, a dielectric layer 305 may be formed and patterned above a structure layer 300, such as a semiconducting substrate (e.g., a silicon wafer), having zero, one or more process layers and/or semiconductor devices such as a metal-oxide-semiconductor field effect transistor (MOSFET or MOS transistor) disposed thereon, for example. The dielectric layer 305 may be formed by a variety of known techniques for forming such layers, e.g., chemical vapor deposition (CVD), low-pressure chemical vapor deposition (LPCVD), plasma-enhanced chemical vapor deposition (PECVD), sputtering or physical vapor deposition (PVD), and the like, and may have a thickness ranging from approximately 100–5000 Å, for example.

The dielectric layer 305 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the dielectric layer 305 is comprised of a silicon dioxide ($SiO_2$) having a thickness of approximately 5000 Å, which is formed by a TEOS chemical vapor deposition (TEOS CVD) process.

The metal layer 310 may be formed by a variety of known techniques, e.g., high-density ionized metal plasma (IMP) deposition, high-density inductively coupled plasma (ICP) deposition, sputtering or physical vapor deposition (PVD), chemical vapor deposition (CVD), and the like, and may have a thickness $t_{d1}$ ranging from approximately 500–10,000 Å. The thickness $t_{d1}$ of the metal layer 310 may be measured in the measuring step j 110 in any of a number of ways (not shown), such as by using a MetaPulse® device, a sheet resistance tool (the sheet resistivity depends on the thickness of the metal layer 310), and the like. The thickness uniformity of the metal layer 310 may also be measured and determined during this measuring process. That is, the measurement step may be used to determine across-layer thickness variations of the metal layer 310, e.g., edge thick, edge thin, etc. The metal layer 310 may be formed of a variety of metals such as aluminum (Al), titanium (Ti), zirconium (Zr), tungsten (W), tantalum (Ta), nickel (Ni), molybdenum (Mo), cobalt (Co), titanium nitride (TiN) and the like.

As shown in FIG. 4, an anti-reflective coating (ARC) layer 315 may be formed above the metal layer 310. For example, an inorganic bottom anti-reflective coating (BARC) layer 315, comprising SiN and/or $SiO_xN_y$ may be used in deep ultraviolet (DUV) photolithography, and may be formed above the metal layer 310. The anti-reflective coating (ARC) layer 315 may be formed by a variety of known techniques for forming such layers, e.g., chemical vapor deposition (CVD), low-pressure chemical vapor deposition (LPCVD), plasma-enhanced chemical vapor deposition (PECVD), sputtering or physical vapor deposition (PVD), and the like, and may have a thickness ranging from approximately 100–500 Å, for example. If desired, although not depicted in the drawings, there may be an additional hard mask layer comprised of, for example, a deposited oxide (TEOS or silane) above the ARC layer 315 using a CVD or PVD process.

As shown in FIG. 4, a photoresist layer 320 is formed above the anti-reflective coating (ARC) layer 315. The photoresist layer 320 may have a thickness ranging from approximately 1000–15,000 Å, for example. The photoresist layer 320 may be patterned, using conventional photolithography, and used to remove portions of the anti-reflective coating (ARC) layer 315.

As shown in FIG. 5, in various illustrative embodiments of the present invention, the patterned photoresist layer 320 may be used to remove portions (indicated in phantom) of the metal layer 310. The removal, by etching, for example, of the portions (indicated in phantom) of the metal layer 310 leaves protected portions 410 of the metal layer 310. For example, the etching process may be a plasma etching process performed using an Applied Materials $M_xP$ 5000/5200 and DPS 5200/5300 tool using an etch species comprised of $BCl_3$, $CHF_3$, Ar, N, $CF_4$ and $Cl_2$. Etch times may range between approximately 80–120 seconds for layers having thicknesses of approximately 4000–8000 Å, respectively.

As shown in FIG. 6, the metal layer 310 may be formed to have a thickness $t_{d2}$ ranging from approximately 300–10,000 Å. The thickness $t_{d2}$ may be less than the thickness $t_{d1}$ of the metal layer 310. The thickness $t_{d2}$ may be measured in the measuring step j 110 in any of a number of ways (not shown), such as by using a MetaPulse® device, a sheet resistance tool (the sheet resistivity depends on the thickness of the metal layer 310), and the like. Both techniques may be used to capture the absolute thickness of the metal layer 310 and the across-layer thickness uniformity. of the metal layer 310, e.g., radial variations (center thin or center thick, etc.).

As described above, FIG. 1 schematically illustrates conventional etch processing used to form a metal layer portion 610. The conventional etch processing used to form the metal layer portion 610 is designed for metal layers as thick as $t_{d1}$ (FIGS. 4 and 5), and leads to gouging 605 of the underlying dielectric layer 305, and undercutting 600 of the overlying anti-reflective coating layer 315 when the metal layer 310 is thinner than anticipated, e.g., when the metal layer 310 (FIG. 6) is only as thick as $t_{d2}$ (FIGS. 1 and 6). The gouging 605 of the underlying dielectric layer 305 and/or undercutting 600 of the overlying anti-reflective coating layer 315, in turn, decreases the ability to fill gaps with a subsequent gap-filling dielectric deposition. As described above, this may lead to inaccuracies and complications in the manufacturing processes. Moreover, with endpoint etching techniques, one area may be clear when another is not, due to thickness variations in the metal layer 310.

By way of contrast, as shown in FIG. 7, in various illustrative embodiments of the present invention, by feeding forward the measured thickness of the metal layer to be etched, e.g., thickness $t_{d2}$ of the metal layer 310 measured in the measuring step j 110, the removal, by etching, for example, of the portions (indicated in phantom) of the metal layer 310 may be accomplished with decreased gouging 605 of the underlying dielectric layer 305 and/or undercutting 600 of the overlying anti-reflective coating layer 315, as compared with that shown in FIG. 1. The decreased gouging 605 of the underlying dielectric layer 305 and/or undercutting 600 of the overlying anti-reflective coating layer 315, as compared with that shown in FIG. 1, in turn, increases the ability to fill gaps with a subsequent gap-filling dielectric deposition.

Figure 8:
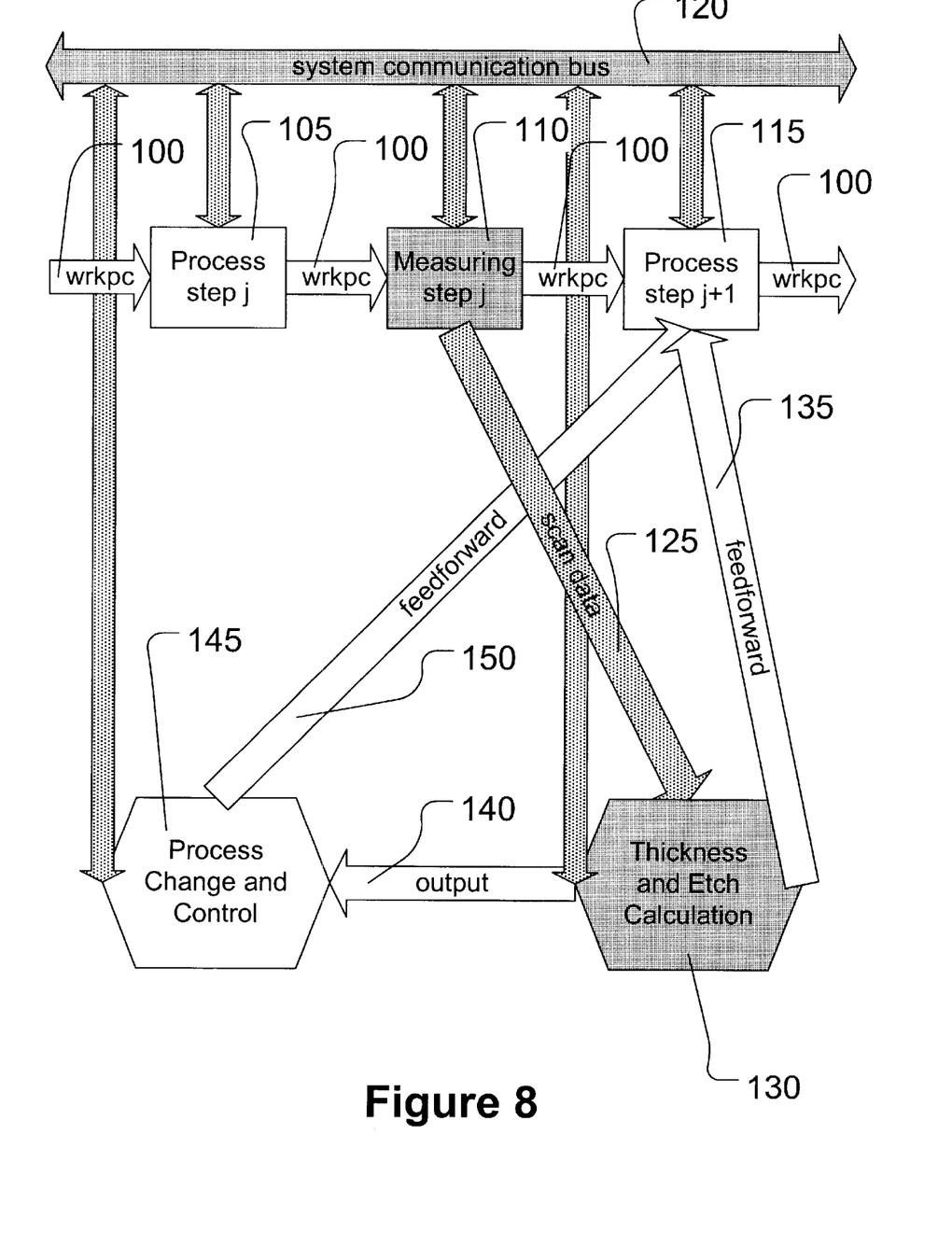

As shown in FIG. 8, the scan data 125 is sent from the measuring step j 110 and delivered to a thickness and etch calculation step 130. In the thickness and etch calculation step 130, one or more thickness measurements and/or across-layer thickness uniformity measurements of the metal layer 310 measured in the measuring step j 110 may be input into a thickness and etch calculation model. The thickness and etch calculation model may calculate, depending on the complexity of the etch processing in the process step j+1 115, one or more etch times to be set in the process step j+1 115, based on the measured thickness (such as $t_{d1}$ or $t_{d2}$) and/or across-layer thickness uniformity of the metal layer 310 measured in the measuring step j 110. For example, the etch time may vary between approximately 80–120 seconds for layers having a thickness ranging from approximately 4000–8000 Å. Additionally, please note that the change in etch time could be the overetch time. Alternatively, instead of calculating an etch time, the present invention may be used to vary other parameters, e.g., to calculate changes in pressure, backside cooling or amount of overetch, etc., for the etching process. Variations in pressure and cooling may affect radial etch patterns. Delivering the scan data 125 to the thickness and etch calculation step 130 produces an output signal 140. As shown in FIG. 8, using the system communication bus 120, scan data 125 from the measuring step j 110, where j may have any value from j=1 to j=N, may be exchanged between, and made available to, any or all of the various N processing and/or N measuring steps.

The thickness and/or across-layer thickness uniformity of the metal layer 310 measured in the measuring step j 110 may be used to alert an engineer of the need to adjust the processing performed any of the previous and/or subsequent processing steps (such as processing step j 105, where j may have any value from j=1 to j=N). The engineer may also alter, for example, the target thickness (such as $t_{d1}$ or $t_{d2}$) or target across-layer thickness uniformity for the metal layer 310, based upon the output signal 140 produced.

Figure 9:
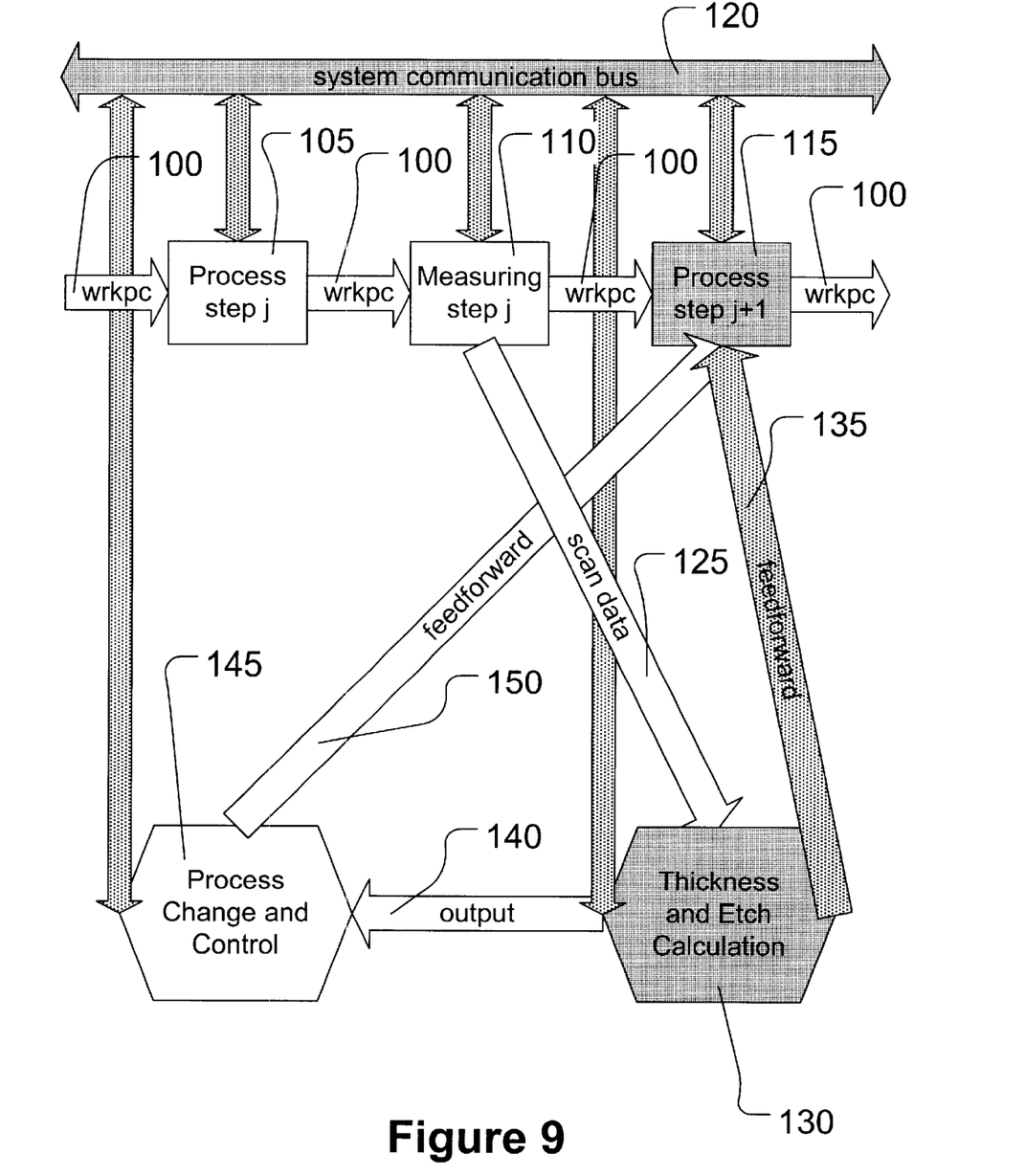

As shown in FIG. 9, a feedforward control signal 135 may be sent from the thickness and etch calculation step 130 to the processing step j+1 115 to adjust the processing performed in the processing step j+1 115. For example, depending on the complexity of the etch processing to be performed in the process step j+1 115, and/or depending on the thickness (such as $t_{d1}$ or $t_{d2}$) and/or across-layer thickness uniformity of the metal layer 310 measured in the measuring step j 110, the feedforward control signal 135 may be sent from the thickness and etch calculation step 130 to the processing step j+1 115 to adjust the processing performed in the processing step j+1 115 so that one or more parameters, e.g., etch times, pressure, backside cooling, etc, may be appropriately set for the process step j+1 115. In various alternative illustrative embodiments (not shown), the feedforward control signal 135 may be sent, using the system communication bus 120, for example, from the thickness and etch calculation step 130 to any of the previous and/or subsequent processing steps (similar to processing step j 105, where j may have any value from j=1 to j=N) to adjust the processing performed in any of the previous and/or subsequent processing steps.

Figure 10:
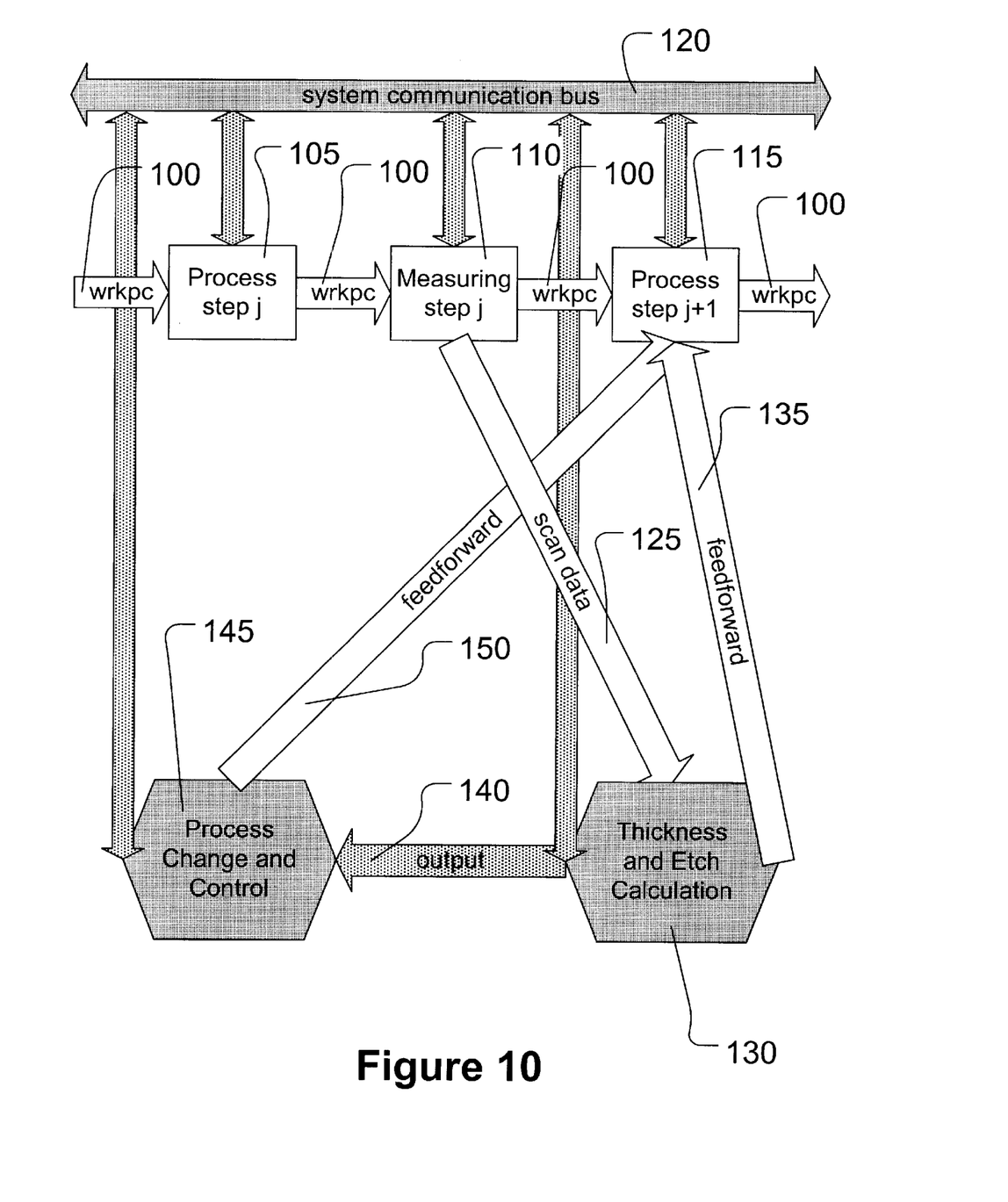
Figure 11:
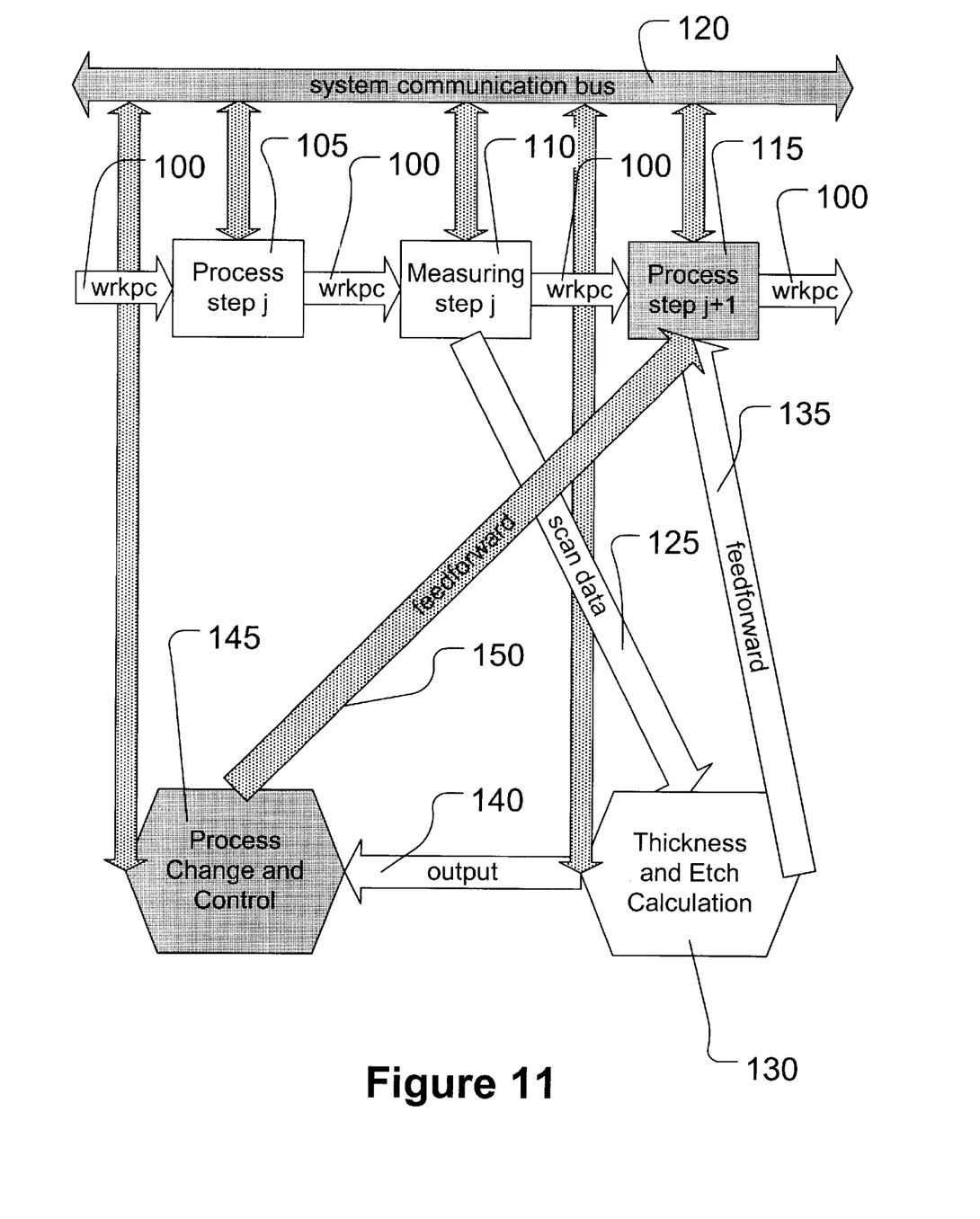

As shown in FIG. 10, in addition to, and/or instead of, the feedforward control signal 135, the output signal 140 may be sent from the thickness and etch calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j+1 115 to adjust the processing performed in the processing step j+1 115. For example, depending on the complexity of the etch processing to be performed in the process step j+1 115, and/or depending on the thickness (such as $t_{d1}$ or $t_{d2}$) and/or across-layer thickness uniformity of the metal layer 310 measured in the measuring step j 110, the feedforward control signal 150 may be sent from the process change and control step 145 to the processing step j+1 115 to adjust the processing performed in the processing step j+1 115 so that one or more parameters, e.g., etch times, pressure, backside cooling, etc., may be appropriately set for the process step j+1 115.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 12:
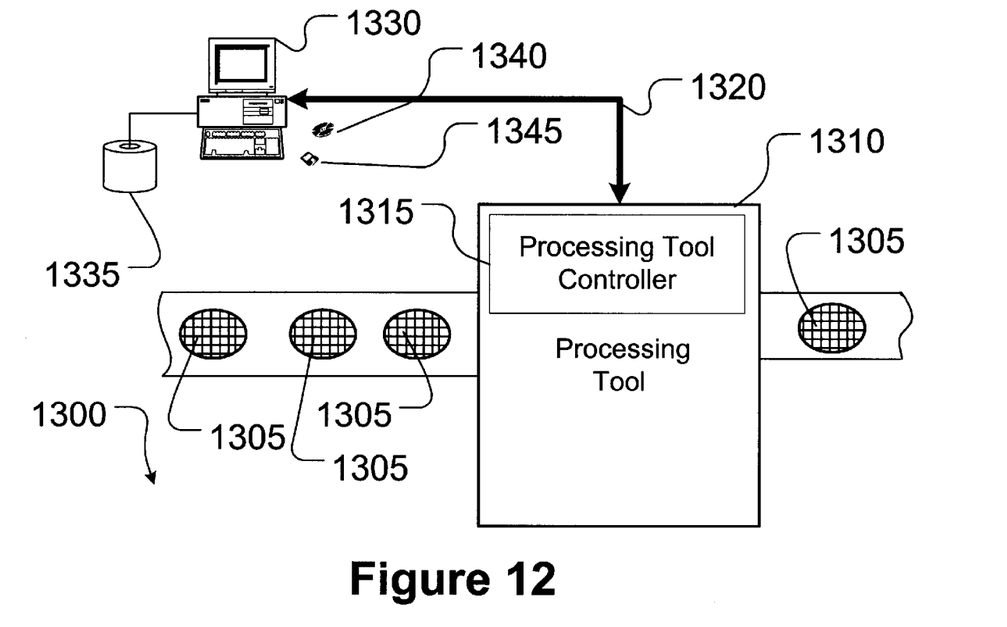
FIG. 12 schematically illustrates workpieces being processed using a processing tool, using a plurality of control input signals, in accordance with the present invention.

FIG. 12 illustrates one particular apparatus 1300 with which the method of the present invention may be practiced. For the sake of clarity, and to further an understanding of the invention, the method shall be disclosed in the context of the apparatus 1300. However, the invention is not so limited and admits wide variation, as is discussed further below.

Referring now to FIG. 12, a batch or lot of workpieces or wafers 1305 is being processed through a processing tool 1310. The processing tool 1310 may be any processing tool known to the art that is adapted to perform an etching process on the metal layer 310, provided it comprises the requisite control capabilities. The processing tool 1310 comprises a processing tool controller 1315 for this purpose. The nature and function of the processing tool controller 1315 will be implementation specific. For instance, the fool controller 1315 may control various input parameters to the etching process, such as etch duration, gas flow rates, pressure, backside cooling, power setting, etc. These control input parameters will, in turn, control the etching process performed on the metal layer 310 (FIG. 3). Four workpieces 1305 are shown in FIG. 12, but the lot of workpieces or wafers, i.e., the "wafer lot," may be any practicable number of wafers from one to any finite number.

In one illustrative embodiment, the method begins by forming a metal layer above a structure layer on a workpiece 1305 in any of a variety of deposition tools (not shown) suitable for forming the metal layer 310. For example, the metal layer 310 may be formed using an Ionized Metal Plasma (IMP) tool, a PVD tool, or an HCM (Hollow Cathode Magnetron) tool. The metal layer 310 formed in such a process may be any type of metal, and it may be formed to any desired nominal or target thickness.

The illustrative method the involves the step of measuring a thickness of the metal layer. For example, a metrology tool (not shown) may measure the thickness (such as $t_{d1}$ or $t_{d2}$) and/or across-layer thickness uniformity of the metal layer 310 (FIG. 3). The metrology tool may measure the thickness (such as $t_{d1}$ or $t_{d2}$) and/or across-layer thickness uniformity of the metal layer 310, as described above, by using a MetaPulse® device, a sheet resistance tool (the sheet resistivity depends on the thickness of the metal layer 310), and the like. Alternatively, and/or additionally, the metrology tool may measure an average of the thicknesses (such as $t_{d1}$ or $t_{d2}$) of the metal layers of two or more of the workpieces 1305 in a lot, and this metrology tool may vary from wafer to wafer depending on the ambient temperature of the wafer(s). Moreover, the number of measurements taken per wafer may vary as a matter of design choice.

In some embodiments, the metrology tool typically may provide the metal layer thickness information to the computer system 1330. The metal layer thickness information of a workpiece 1305, and/or an average of the metal layer thicknesses of the workpieces 1305 in a lot, is an illustrative example of a parameter characteristic of the processing performed on the workpiece in the processing tool 1310. The computer system 1330 in FIG. 12 is, in this particular embodiment, programmed to calculate and/or model variations in the metal layer thickness and/or across-layer thickness uniformity, as compared with one or more target values. The manner in which this calculating and/or modeling occurs will be implementation specific. For example, depending on the complexity of the etch processing to be performed on the metal layer, and/or depending on the thickness (such as $t_{d1}$ or $t_{d2}$) and/or across-layer thickness uniformity of the metal layer 310 (FIG. 3) one or more parameters of an etch process to be performed on the metal layer may be controlled or adjusted, e.g., etch time, process gas flow rates, pressure, backside cooling, power settings, etc.

The method then proceeds by determining, based upon the measured thickness of the metal layer (such as $t_{d1}$, $t_{d2}$ and/or across-layer thickness uniformity), at least one parameter of an etching process to be performed on the metal layer. Depending on the implementation, applying the measurement of the thickness and/or across-layer thickness uniformity of the metal layer, the appropriate thickness and etch model may yield either a new value for the control input parameter or a correction to the existing control input parameter for the metal etch processing tool 1310 that is used to remove at least a portion of the metal layer 310. The new control input is then formulated from the value yielded by the thickness and etch calculation and/or model and is transmitted to the etch tool controller 1315. The etch tool controller 1315 then controls subsequent etching operations in accordance with the new control inputs. That is, the method concludes with performing the etching process comprised of the determined parameter on the metal layer 310.

For example, as shown in FIG. 9, described above, a feedforward control signal 135 may be sent from the thickness and etch calculation step 130 to the processing step j+1 115 to adjust the processing performed in the processing step j+1 115. For example, depending on the complexity of the etch processing to be performed in the process step j+1 115, and/or depending on the thickness (such as $t_{d1}$ or $t_{d2}$) and/or across-layer thickness uniformity of the metal layer 310 measured in the measuring step j 110, the feedforward control signal 135 may be sent from the thickness and etch calculation step 130 to the processing step j+1 115 to adjust the processing performed in the processing step j+1 115 so that one or more parameters of the process step j+1 115 may be adjusted or controlled. In various alternative illustrative embodiments (not shown), the feedforward control signal 135 may be sent, using the system communication bus 120, for example, from the thickness and etch calculation step 130 to any of the previous and/or subsequent processing steps (similar to processing step j 105, where j may have any value from j=1 to j=N) to adjust the processing performed in any of the previous and/or subsequent processing steps.

Similarly, as shown in FIG. 10, also described above, in addition to, and/or instead of, the feedforward control signal 135, the output signal 140 may be sent from the thickness and etch calculation step 130 and delivered to a process change and control step 145. In the process change and control step 145, the output signal 140 may be used in a high-level supervisory control loop. Thereafter, as shown in FIG. 11, a feedforward control signal 150 may be sent from the process change and control step 145 to the processing step j+1 115 to adjust the processing performed in the processing step j+1 115. For example, depending on the complexity of the etch processing to be performed in the process step j+1 115, and/or depending on the thickness (such as $t_{d1}$ or $t_{d2}$) and/or across-layer thickness uniformity of the metal layer 310 measured in the measuring step j 110, the feedforward control signal 150 may be sent from the process change and control step 145 to the processing step j+1 115 to adjust or control one or more parameters of the processing operations performed in the processing step j+1 115.

Some alternative embodiments may employ a form of feedback to improve the modeling of characteristic parameters. The implementation of this feedback is dependent on several disparate facts, comprising the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention may be implemented in software. For instance, the various steps described herein may be implemented, in whole or in part, in software. Thus, some features of the present invention are implemented as instructions encoded on a computer-readable, program storage medium. The program storage medium may be of any type suitable to the particular implementation. However, the program storage medium will typically be magnetic, such as the floppy disk 1345 or the computer 1330 hard disk drive (not shown), or optical, such as the optical disk 1340. When these instructions are executed by a computer, they perform the disclosed functions. The computer may be a desktop computer, such as the computer 1330. However, the computer might alternatively be a processor embedded in the processing tool 1310. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Any of the above-disclosed embodiments of a method of manufacturing according to the present invention enables the etching of metal layers with less over-etching and decreased gouging of any underlying dielectric layers and/or decreased undercutting or "footing" of any overlying anti-reflective coating layers and/or bottom films. The decreased gouging of any underlying dielectric layers and/or decreased undercutting or "footing" of any overlying anti-reflective coating layers and/or bottom films, in turn, increases the ability to fill gaps with a subsequent gap-filling dielectric deposition. Any of the above-disclosed embodiments of a method according to the present invention enables the use of parametric measurements sent from measuring tools to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

In one illustrative embodiment, the method disclosed herein comprises forming a metal layer above a structure layer on a workpiece, measuring a thickness of the metal layer, determining, based upon the measured thickness of the metal layer, at least one parameter of an etching process to be performed on the metal layer, and performing the etching process comprised of the determined parameter on the metal layer.

In another embodiment, the present invention is directed to a system comprised of a deposition tool for forming a metal layer above a structure layer on a workpiece, a metrology tool for measuring a thickness of the metal layer, a controller for determining, based upon the measured thickness of the metal layer, at least one parameter of an etch process to be performed on the metal layer, and an etch tool adapted to perform an etch process comprised of the determined parameter on the metal layer.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method comprising:
    forming a metal layer above a structure layer on a workpiece;
    measuring a thickness of the metal layer;
    determining, based upon said measured thickness of said metal layer, at least one parameter of an etching process to be performed on said metal layer; and
    performing said etching process comprised of said determined parameter on said metal layer.

2. The method of claim 1, wherein forming the metal layer above the structure layer comprises forming the metal layer above the structure layer comprising a dielectric layer.

3. The method of claim 1, further comprising forming an anti-reflective coating (ARC) layer above the metal layer.

4. The method of claim 1, wherein measuring a thickness of the metal layer comprises measuring across-layer thickness uniformity of said metal layer.

5. The method of claim 1, wherein measuring the thickness of the metal layer comprises measuring the thickness of the metal layer using a sheet resistance tool.

6. The method of claim 1, wherein measuring a thickness of the metal layer comprises measuring a thickness of the metal layer at a plurality of locations.

7. The method of claim 1, wherein determining, based upon said measured thickness of said metal layer, at least one parameter of an etching process to be performed on said metal layer comprises determining, based upon said measured thickness of said metal layer, at least one of an etch time, a pressure, a power setting, and a backside cooling gas flow rate for said etching process to be performed on said metal layer.

8. The method of claim 1, wherein forming a metal layer above a structure layer on a workpiece comprises forming a metal layer comprised of at least one of aluminum, titanium, zirconium, tungsten, tantalum, nickel, molybdenum, cobalt and titanium nitride above a structure layer on a workpiece.

9. The method of claim 1, wherein forming a metal layer above said structure layer comprised depositing a metal layer above said structure layer.

10. A method comprising:
    depositing a metal layer above a structure layer comprised of a dielectric material on a workpiece;
    measuring a thickness of the metal layer;
    determining, based upon said measured thickness of said metal layer, at least one parameter of an etching process to be performed on said metal layer; and
    performing said etching process comprised of said determined parameter on said metal layer.

11. The method of claim 10, further comprising forming an anti-reflective coating (ARC) layer above the metal layer.

12. The method of claim 10, wherein measuring a thickness of the metal layer comprises measuring across-layer thickness uniformity of said metal layer.

13. The method of claim 10, wherein measuring the thickness of the metal layer comprises measuring the thickness of the metal layer using a sheet resistance tool.

14. The method of claim 10, wherein measuring a thickness of the metal layer comprises measuring a thickness of the metal layer at a plurality of locations.

15. The method of claim 10, wherein determining, based upon said measured thickness of said metal layer, at least one parameter of an etching process to be performed on said metal layer comprises determining, based upon said measured thickness of said metal layer, at least one of an etch time, a pressure, a power setting, and a backside cooling gas flow rate for said etching process to be performed on said metal layer.

16. The method of claim 10, wherein depositing a metal layer above a structure layer on a workpiece comprises depositing a metal layer comprised of at least one of aluminum, titanium, zirconium, tungsten, tantalum, nickel, molybdenum, cobalt and titanium nitride above a structure layer on a workpiece.

17. A method comprising:
    depositing a metal layer above a structure layer on a workpiece;
    measuring an across-layer thickness uniformity of the metal layer;
    determining, based upon said measured across-layer thickness uniformity of said metal layer, at least one parameter of an etching process to be performed on said metal layer; and
    performing said etching process comprised of said determined parameter on said metal layer.

18. The method of claim 17, wherein forming the metal layer above the structure layer comprises forming the metal layer above the structure layer comprising a dielectric layer.

19. The method of claim 17, further comprising forming an anti-reflective coating (ARC) layer above the metal layer.

20. The method of claim 17, wherein measuring the thickness of the metal layer comprises measuring the thickness of the metal layer using a sheet resistance tool.

21. The method of claim 17, wherein measuring an across-layer thickness uniformity of the metal layer comprises measuring an across-layer thickness uniformity of the metal layer by measuring the metal layer at a plurality of locations.

22. The method of claim 17, wherein determining, based upon said measured thickness of said metal layer, at least one parameter of an etching process to be performed on said metal layer comprises determining, based upon said measured thickness of said metal layer, at least one of an etch time, a pressure, a power setting, and a backside cooling gas flow rate for said etching process to be performed on said metal layer.

23. The method of claim 17, wherein depositing a metal layer above a structure layer on a workpiece comprises depositing a metal layer comprised of at least one of aluminum, titanium, zirconium, tungsten, tantalum, nickel, molybdenum, cobalt and titanium nitride above a structure layer on a workpiece.

* * * * *